United States Patent
Imanishi et al.

(10) Patent No.: US 10,340,907 B2
(45) Date of Patent: Jul. 2, 2019

(54) DRIVE DEVICE FOR SEMICONDUCTOR ELEMENT

(71) Applicant: Mitsubishi Electric Corporation, Tokyo (JP)

(72) Inventors: Motoki Imanishi, Fukuoka (JP); Kenji Sakai, Fukuoka (JP); Takaki Nakashima, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 108 days.

(21) Appl. No.: 15/209,783

(22) Filed: Jul. 14, 2016

(65) Prior Publication Data

US 2017/0134018 A1 May 11, 2017

(30) Foreign Application Priority Data

Nov. 5, 2015 (JP) .................................. 2015-217440

(51) Int. Cl.
*H02M 1/32* (2007.01)
*H02H 7/122* (2006.01)
(Continued)

(52) U.S. Cl.
CPC ....... *H03K 17/08116* (2013.01); *H02H 7/122* (2013.01); *H02M 1/32* (2013.01); *H03K 17/18* (2013.01); *H03K 17/567* (2013.01)

(58) Field of Classification Search
CPC ............ H02H 3/08; H02H 7/10; H02H 7/122; H02H 7/1225; H03K 17/18;
(Continued)

(56) References Cited

U.S. PATENT DOCUMENTS 5,115,388 A * 5/1992 Shigekane ............. H02H 5/041
361/106
6,459,380 B1 * 10/2002 Watanabe ............... H02M 1/32
340/635

(Continued)

FOREIGN PATENT DOCUMENTS

JP 2012-010544 A 1/2012
JP 2012-143125 A 7/2012

OTHER PUBLICATIONS

An Office Action mailed by the State Intellectual Property Office of the People's Republic of China dated May 3, 2018, which corresponds to Chinese Patent Application No. 201611026597.2 and is related to U.S. Appl. No. 15/209,783; with English machine translation.

*Primary Examiner* — Ronald W Leja
*Assistant Examiner* — Christopher J Clark
(74) *Attorney, Agent, or Firm* — Studebaker & Brackett PC

(57) ABSTRACT

A drive device to drive a semiconductor element includes: an identification signal generating circuit generating an identification signal depending on a type of an input error signal; a protection operation signal generating circuit generating a protection operation signal having a pulse width equal to that of one of the error signal and the identification signal having a longer pulse width; an identification signal terminal inputting and outputting the identification signal; a protection operation signal terminal inputting and outputting the protection operation signal; and a protection circuit performing an error protection operation depending on an own-phase protection operation signal generated by the protection operation signal generating circuit and an other-phase protection operation signal input through the protection operation signal terminal.

7 Claims, 11 Drawing Sheets

(51) Int. Cl.
*H03K 17/081* (2006.01)
*H03K 17/567* (2006.01)
*H03K 17/18* (2006.01)

(58) Field of Classification Search
CPC ......... H03K 17/08116; H03K 17/08–17/0828;
H02M 1/32
See application file for complete search history.

(56) References Cited

U.S. PATENT DOCUMENTS

| | | | |
|---|---|---|---|
| 9,225,233 B2* | 12/2015 | Nakamori | H02M 1/32 |
| 9,667,061 B2* | 5/2017 | Sekigawa | H02M 1/08 |
| 2002/0039269 A1* | 4/2002 | Kumagai | H02M 1/32 |
| | | | 361/93.1 |
| 2011/0317315 A1* | 12/2011 | Motohashi | H02H 7/122 |
| | | | 361/18 |
| 2012/0146782 A1* | 6/2012 | Komatsu | H03K 17/0822 |
| | | | 340/501 |
| 2013/0229208 A1* | 9/2013 | Hamanaka | H03K 17/081 |
| | | | 327/109 |
| 2014/0009983 A1* | 1/2014 | Nakamori | H02M 1/32 |
| | | | 363/50 |

* cited by examiner

DRIVE DEVICE FOR SEMICONDUCTOR ELEMENT

BACKGROUND OF THE INVENTION

Field

The present invention relates to a drive device to drive a semiconductor element.

Background

In a power semiconductor device such as a three-phase inverter, a plurality of drive devices to drive a plurality of semiconductor elements are disposed. Each of the drive devices has an FO function of informing a control device (MCU) side of an abnormal state simultaneously with operation interruption of the semiconductor element when an error signal is detected by state monitoring (SC, OC, OT, UV, or the like) of the semiconductor element (for example, see Japanese Unexamined Patent Publication No. 2012-10544).

FIG. 13 is a diagram showing a conventional drive device for semiconductor element. FIG. 14 is a timing chart showing an operation of the conventional drive device for semiconductor element. When each drive device receives an error signal from an ERR terminal, the drive device outputs an identification signal from an FO terminal to an MCU. Since the identification signal has different pulse widths depending on the types of error signals, the MCU side can identify an error mode. When a drive device receives an identification signal from another drive device, the corresponding device detects that the other drive device performs an error protection operation, and also performs an error protection operation by itself.

SUMMARY

A conventional drive device outputs an identification signal and detects an error protection operation with one FO terminal. For this reason, when a pulse width of the identification signal is determined depending on the type of an error signal, an error protection operation corresponding to an error signal having a length longer than the pulse width cannot be performed. On the other hand, when the pulse width of the identification signal is made equal to the length of the error signal, the MCU side cannot identify an error mode.

A plurality of error signals cannot be continuously input without mixing identification signals with each other. For example, when a control power supply voltage drop protection operation (UV operation) increases a junction temperature of a semiconductor element to activate a temperature abnormality detection operation (OT operation), the protection operation is performed for both the errors. On the other hand, as an identification signal, an identification signal corresponding to the UV operation serving as a trigger of an error should be precedingly output. However, since an identification signal corresponding to the UV operation and an identification signal corresponding to the OT operation are mixed with each other, the MCU side cannot discriminate the errors from each other.

In a three-phase inverter system or the like, the FO terminals of a plurality of drive devices are collectively coupled to an MCU. Thus, as shown in FIG. 14, when errors continuously occur in own-phase and an other-phase, identification signals in both the phases are mixed with each other to make it impossible to discriminate error modes from each other on the MCU side.

The present invention has been made to solve the above problem, and as its object to obtain a drive device for semiconductor element that can perform an error protection operation independently of an identification signal and can identify an error mode based on an output identification signal.

According to the present invention, a drive device to drive a semiconductor element includes: an identification signal generating circuit generating an identification signal depending on a type of an input error signal; a protection operation signal generating circuit generating a protection operation signal having a pulse width equal to that of one of the error signal and the identification signal having a longer pulse width; an identification signal terminal inputting and outputting the identification signal; a protection operation signal terminal inputting and outputting the protection operation signal; and a protection circuit performing an error protection operation depending on an own-phase protection operation signal generated by the protection operation signal generating circuit and an other-phase protection operation signal input through the protection operation signal terminal.

In the present invention, a protection operation signal having a pulse width equal to that of one of an error signal and an identification signal having a longer pulse width is generated. The identification signal terminal inputting and outputting an identification signal and the protection operation signal terminal inputting and outputting a protection operation signal are independently configured. In this manner, an error protection operation can also be performed independently of the identification signal. Thus, an error protection operation coping with an error signal having a pulse width longer than that of the identification can also performed. Identification signals having pulse widths varying depending on the types of error signals are output to make it possible to identify an error mode on the MCU side.

Other and further objects, features and advantages of the invention will appear more fully from the following description.

DESCRIPTION OF EMBODIMENTS

Figure 1:
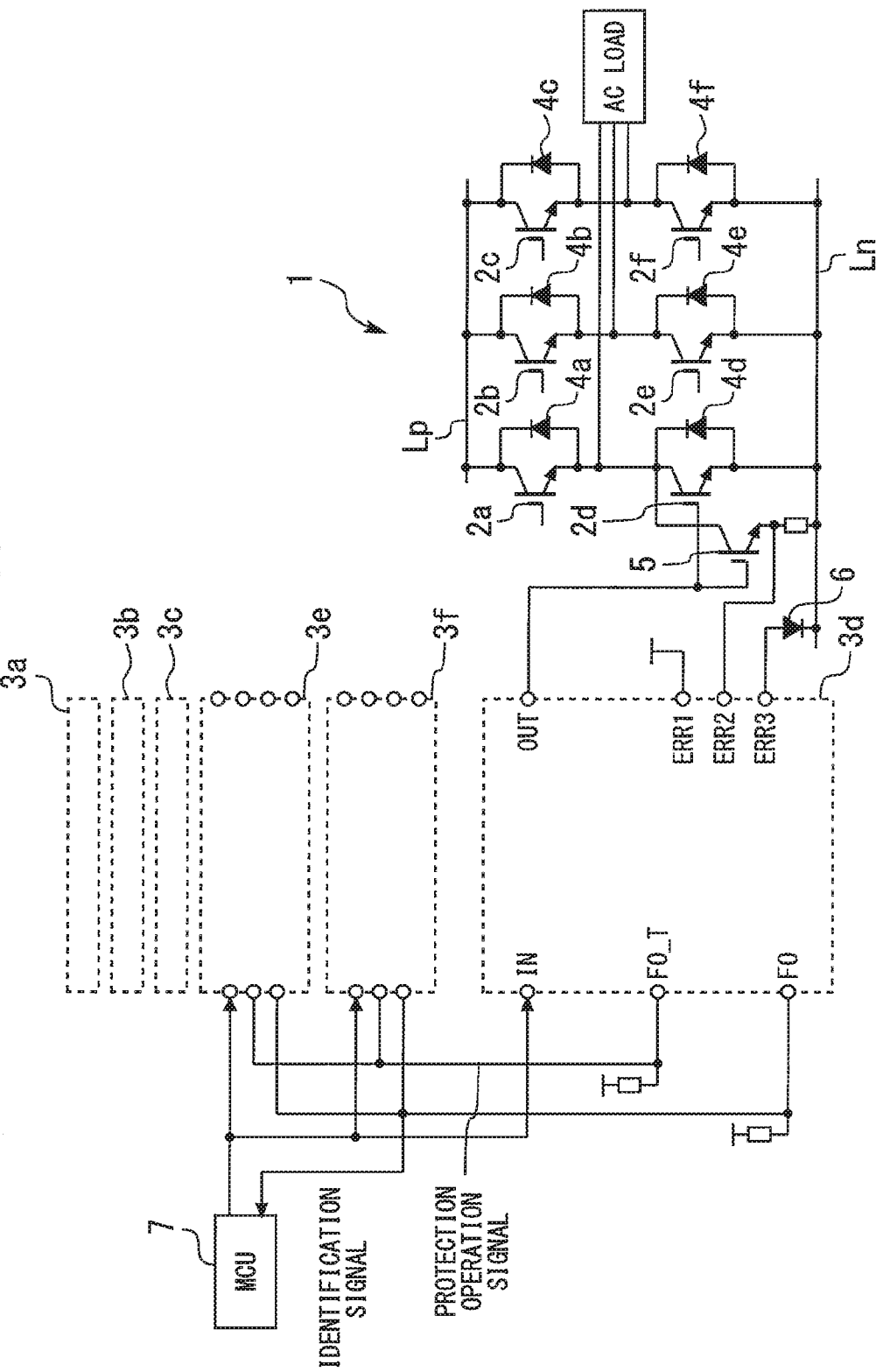
FIG. 1 is a diagram showing a power conversion device according to an embodiment of the present invention.

FIG. 1 is a diagram showing a power conversion device according to an embodiment of the present invention. The power conversion device includes an inverter 1 and drive devices 3a to 3f independently driving six semiconductor elements 2a to 2f constituting the inverter 1.

The semiconductor elements 2a to 2f are IGBTs (Insulated Gate Bipolar Translators). A series circuit including the semiconductor elements 2a and 2d, a series circuit including the semiconductor elements 2b and 2e, and a series circuit including the semiconductor elements 2c and 2f are coupled in parallel with each other between a positive electrode line Lp and a negative electrode line Ln which are coupled to a DC power supply supplying a DC power to the lines Lp and Ln. Flywheel diodes 4a to 4f are coupled in antiparallel with the semiconductor elements 2a to 2f, respectively.

The semiconductor elements 2a, 2b, and 2c are defined as U-phase, V-phase, and W-phase semiconductor elements, respectively, to constitute an upper arm UA, and the semiconductor elements 2d, 2e, and 2f are defined as X-phase, Y-phase, and Z-phase semiconductor elements to constitute a lower arm LA. Three-phase AC powers are output from a coupling point between the semiconductor elements 2a and 2d, a coupling point between the semiconductor elements 2b and 2e and a coupling point between the semiconductor elements 2c and 2f, and the three-phase AC powers are supplied to AC loads such as an electric motor.

Each of the semiconductor elements 2a to 2f has a current sensing transistor 5 detecting a current flowing between a collector and an emitter and a temperature detection diode 6 buried in the same chip as that of the corresponding semiconductor element. The collector and the gate of the current sensing transistor 5 are coupled to the collector and the gate of the corresponding semiconductor element, respectively.

The drive devices 3a to 3f have the same configurations, respectively. Each of the drive devices 3a to 3f has an input terminal IN receiving a pulse width modulation signal for gate driving from an external control device 7 (MCU), an output terminal OUT outputting a gate drive signal to the gate of the corresponding semiconductor element, error terminals ERR1, ERR2, and ERR3, an FO terminal (identification signal terminal) inputting and outputting an identification signal, and an FO_T terminal (protection operation signal terminal) inputting and outputting a protection operation signal. The FO terminals of the drive devices 3a to 3f are collectively coupled to the control device 7. The FO_T terminals of the drive devices 3a to 3f are coupled to each other.

The error terminal EER1 receives a driver power supply voltage supplied to each of the drive devices, the error terminal ERR2 is coupled to the emitter of the current sensing transistor 5, and the error terminal ERR3 is coupled to the anode of the temperature detection diode 6.

Figure 2:
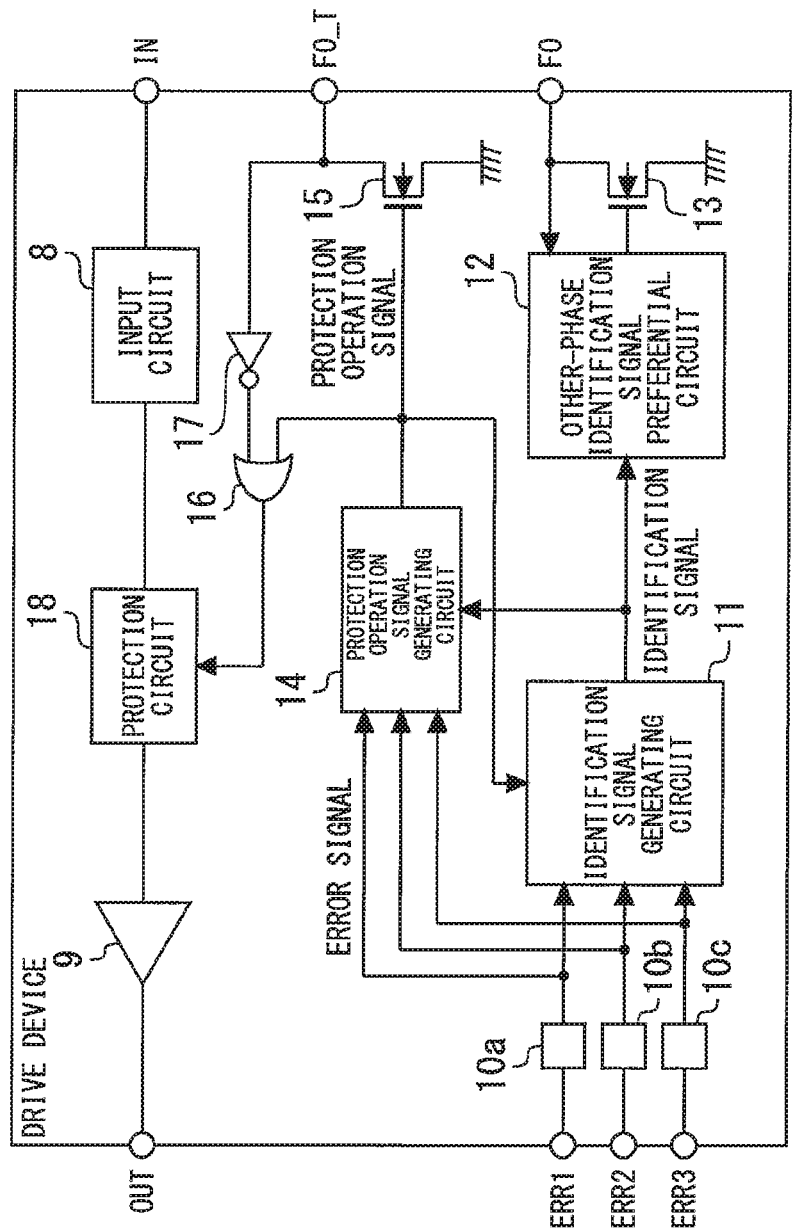
FIG. 2 is a diagram showing a drive device for semiconductor element according to the embodiment of the present invention.

FIG. 2 is a diagram showing a drive device for semiconductor element according to the embodiment of the present invention. An input circuit 8 performs signal processing such as waveform shaping to a pulse width modulation signal input from the input terminal IN. An amplifier 9 amplifies an output from the input circuit 8 to cause the output terminal OUT to output the amplified signal as a gate drive signal.

Error signal generating unit 10a, 10b, and 10c generate error signals depending on signals received from the error terminals ERR1, ERR2, and ERR3, respectively. More specifically, the error signal generating unit 10a outputs an error signal corresponding to power supply voltage drop protection (UV) when the driver power supply voltage decreases to a predetermined voltage or less. The error signal generating unit 10b outputs an error signal corresponding over-current protection (OC) and short-circuit protection (SC) when an input current flowing in the current sensing transistor 5 increases to an over-current threshold value or more. The error signal generating unit 10c detects a chip temperature based on an inter-terminal voltage from the temperature detection diode 6, and outputs an error signal corresponding to over-heat protection (OT) when the detected chip temperature increases to a predetermined over-heat threshold value or more.

An identification signal generating circuit 11 generates an identification signal having pulse widths (Duties) varying depending on the types of input error signals. The identification signal is output from the FO terminal through an other-phase identification signal preferential circuit 12 and a transistor 13.

A protection operation signal generating circuit 14 generates a protection operation signal having a pulse width equal to that of one of the error signal and the identification signal having a longer pulse width. The protection operation signal is output from the FO_T terminal through a transistor 15.

The protection operation signal output from the protection operation signal generating circuit 14 is input to an OR circuit 16, and an other-phase protection operation signal input through the $FO_{13}$ T terminal is also input to the OR circuit 16 through an inverter 17. An output from the OR circuit 16 is input to the protection circuit 18. The protection circuit 18 performs operation interruption (error protection operation) of the semiconductor element depending on an own-phase protection operation signal generated by the protection operation signal generating circuit 14 and an other-phase protection operation signal input through the $FO_{13}$T terminal.

Figure 3:
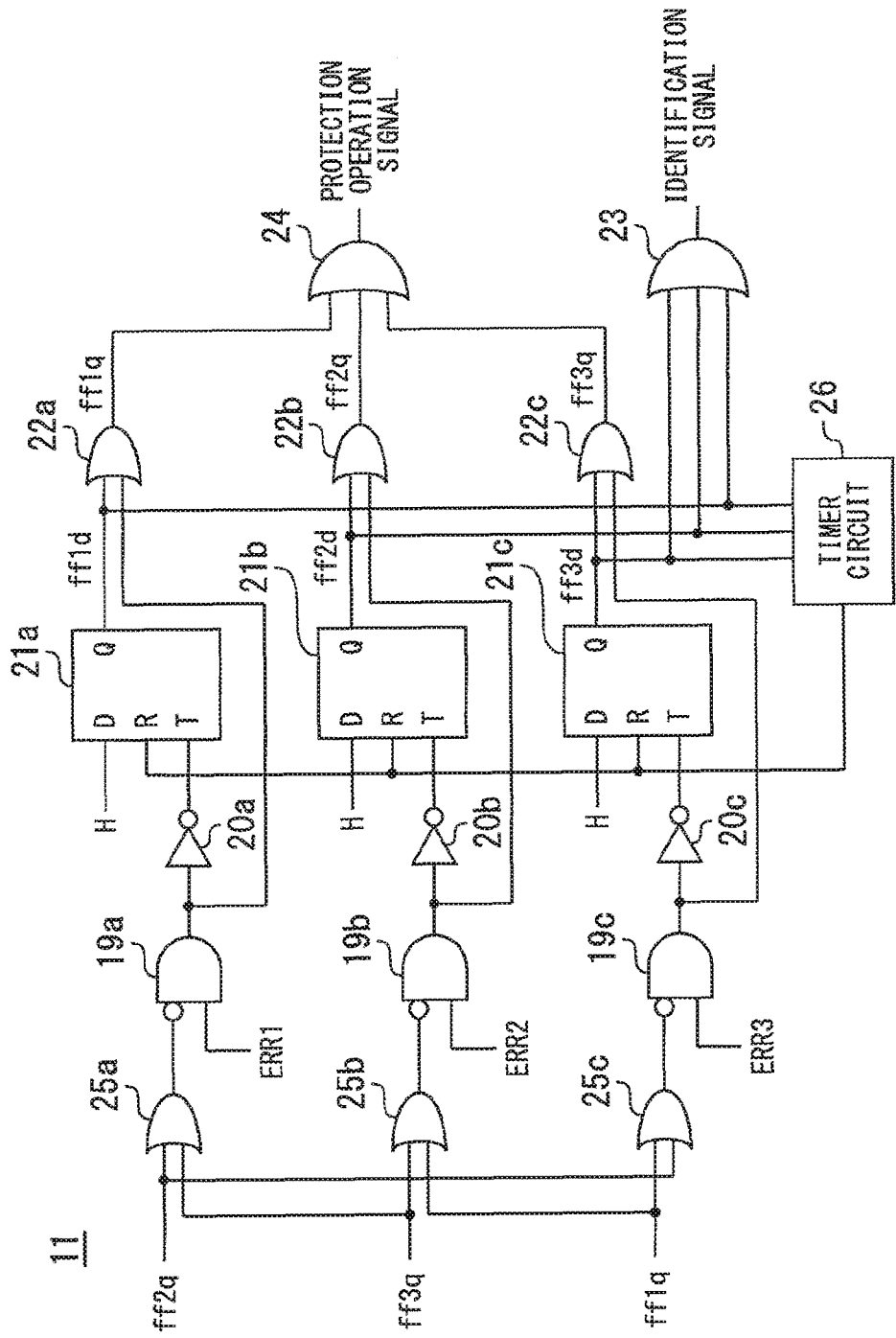
FIG. 3 is a diagram showing an identification signal generating circuit and a protection operation signal generating circuit according to the embodiment of the present invention.

FIG. 3 is a diagram showing an identification signal generating circuit and a protection operation signal generating circuit according to the embodiment of the present invention. Error signals ERR1, ERR2, and ERR3 are input to T terminals of D flip-flop circuits 21a, 21b, and 21c through AND circuits 19a, 19b, and 19c and inverters 20a, 20b, and 20c, respectively. High-level voltages are applied to D terminals of the D flip-flop circuits 21a, 21b, and 21c. Outputs from the AND circuits 19a, 19b, and 19c and outputs from the D flip-flop circuits 21a, 21b, and 21c are input to OR circuits 22a, 22b, and 22c.

Outputs ff1d, ff2d, and ff3d from the D flip-flop circuits 21a, 21b, and 21c are input to an OR circuit 23, and an output from the OR circuit 23 serves as an identification signal. Outputs ff1q, ff2q, and ff3q from the OR circuits 22a, 22b, and 22c are input to an OR circuit 24, and an output from the OR circuit 24 serves as a protection operation signal.

The ff1q is input to the OR circuits 25b and 25c, the ff2q is input to the OR circuits 25a and 25c, and the ff3q is input to the OR circuits 25a and 25b. Outputs from the OR circuits 25a, 25b, and 25c are inversely input to the AND circuits 19a, 19b, and 19c, respectively. When a predetermined period of time has elapsed after the timer circuit 26 receives the ff1*d*, ff2*d*, and ff3*d*, the timer circuit 26 outputs a reset signal of each R terminal of the D flip-flop circuits 21*a*, 21*b*, and 21*c*.

The OR circuits 22*a*, 22*b*, 22*c*, and 24 of the above configuration correspond to the protection operation signal generating circuit 14, and the other configuration corresponds to the identification signal generating circuit 11. In the identification signal generating circuit 11, the D flip-flop circuits 21*a*, 21*b*, and 21*c* use the error signals ERR1, ERR2, and ERR3 as edge triggers, respectively. The timer circuit 26 begins to operate depending on the outputs from the D flip-flop circuits 21*a*, 21*b*, and 21*c*, and, after a predetermined period of time has elapsed, the timer circuit 26 resets the D flip-flop circuits 21*a*, 21*b*, and 21*c*. In this manner, the identification signal generating circuit 11 changes an output period, i.e., a pulse width of an identification signal depending on outputs from the timer circuit 26. Thus, identification signals having different pulse widths are generated depending on the types of the error signals ERR1, ERR2, and ERR3.

When any one of the protection operation signals ff1*q*, ff2*q*, and ff3*q* is output, the preferential circuit including the AND circuits 19*a*, 19*b*, and 19*c* and the OR circuits 25*a*, 25*b*, and 25*c* prevents an error signal from being input to the D flip-flop circuit corresponding to another protection operation signal. Thus, when a second error signal is input while a protection operation signal corresponding to a first error signal previously input is outputting, the identification signal generating circuit 11 does not generate the identification signal corresponding to the second error signal.

Figure 4:
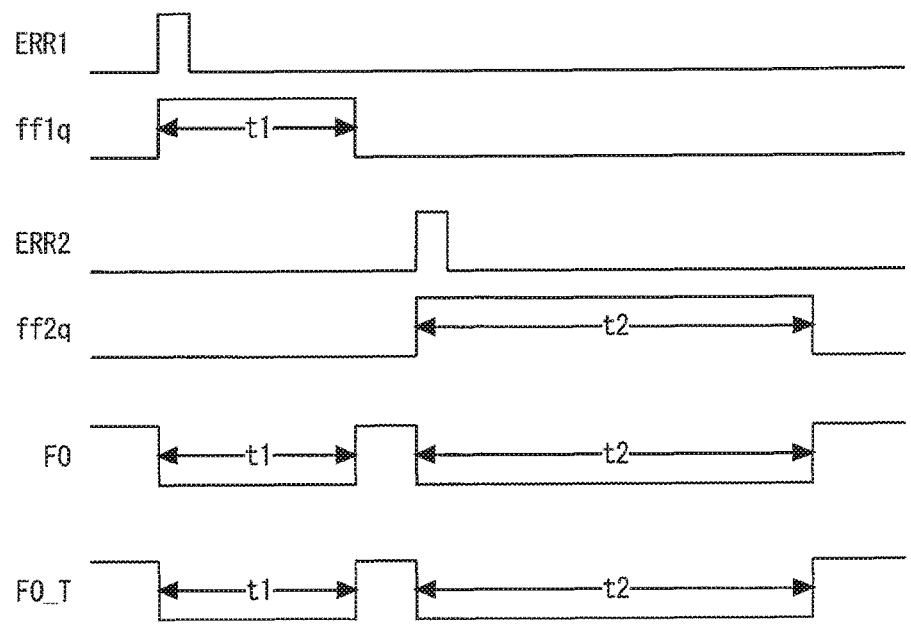
FIGS. 4 to 7 are timing charts showing operations of the identification signal generating circuit and the protection operation signal generating circuit according to the embodiment of the present invention.

FIGS. 4 to 7 are timing charts showing operations of the identification signal generating circuit and the protection operation signal generating circuit according to the embodiment of the present invention. As shown in FIG. 4, when the error signal ERR1 is input, the protection operation signal ff1*q* having a pulse width t1 is generated. When the error signal ERR2 is input after the protection operation signal ff1*q* is output, the protection operation signal ff2*q* having a pulse width t2 is generated.

Figure 5:
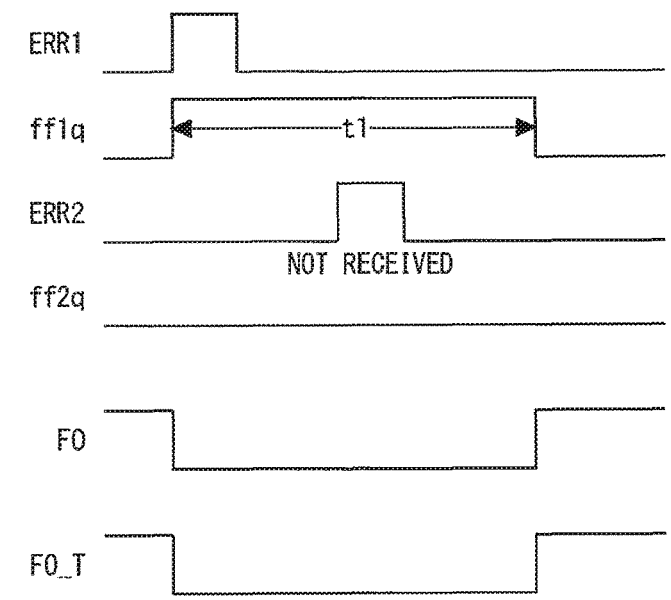

On the other hand, as shown in FIG. 5, even though the error signal ERR2 is input while the protection operation signal ff1*q* is output, the error signal ERR2 is not input to the D flip-flop circuit 21*b*, and an identification signal and a protection operation signal corresponding to the error signal ERR2 are not generated.

Figure 6:
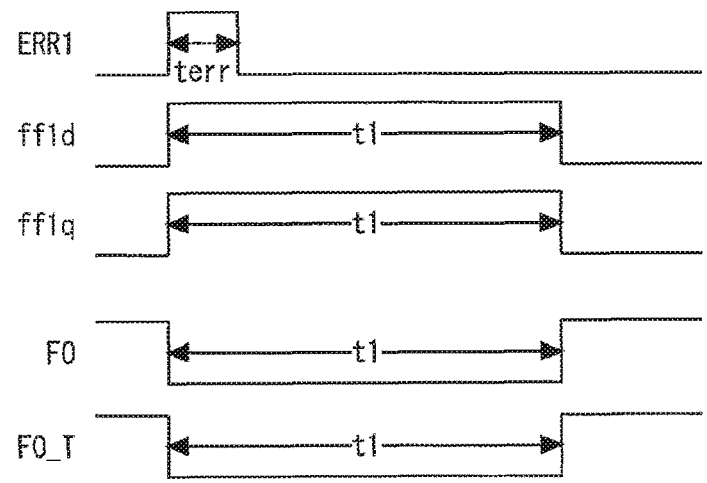

As shown in FIG. 6, when a pulse width terr of the error signal ERR1 is shorter than the pulse width t1 of the identification signal ff1*d* corresponding to the error signal ERR1, the protection operation signal ff1*q* having the same pulse width t1 as that of the identification signal ff1*d* is generated.

Figure 7:
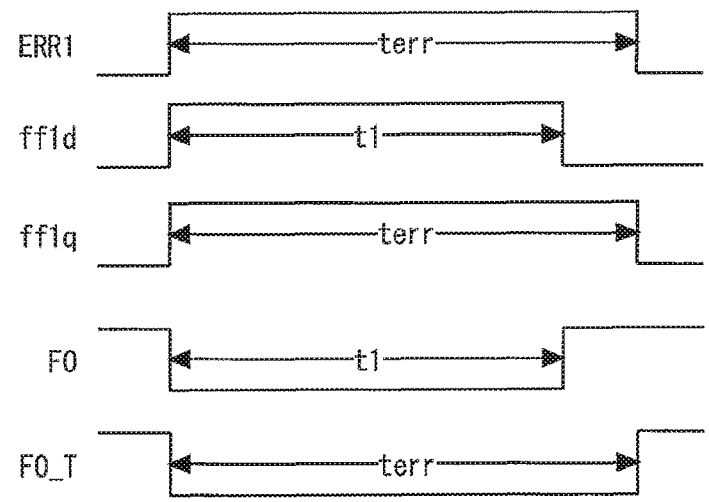

On the other hand, as shown in FIG. 7, when the pulse width terr of the error signal ERR1 is longer than the pulse width t1 of the identification signal ff1*d* corresponding to the error signal ERR1, the protection operation signal ff1*q* having the same pulse width terr as that of the error signal ERR1 is generated. Thus, an error protection operation corresponding to an error signal having a pulse width longer than that of an identification can also be performed.

Figure 8:
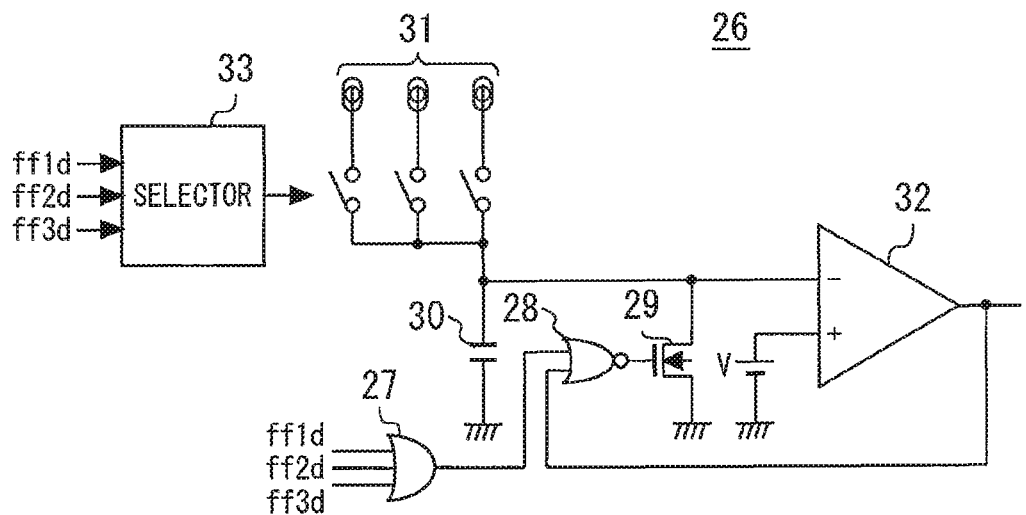
FIG. 8 is a diagram showing a first example of a timer circuit according to the embodiment of the present invention.

FIG. 8 is a diagram showing a first example of a timer circuit according to the embodiment of the present invention. The ff1*d*, ff2*d*, and ff3*d* corresponding to error signals are input to an OR circuit 27, and an output from the OR circuit 27 is input to a NOR circuit 28. A transistor 29 connects or disconnects a capacitor 30 to/from the ground. When any one of the ff1*d*, ff2*d*, and ff3*d* is input, the transistor 29 is turned off, and a current source 31 begins to electrically charge the capacitor 30. A comparator 32 outputs a signal until a voltage of the capacitor 30 reaches a threshold voltage V thereby indicating a time taken to charge the capacitor.

In the first example, a selector 33 selects a current value of the current source 31 electrically charging the capacitor 30 depending on the types of error signals. In this manner, identification signals having pulse widths varying depending on the types of the error signals can be generated. In addition, since the selection of the current value can be configured by only a change of a current mirror unit, the circuit can be simplified.

Figure 9:
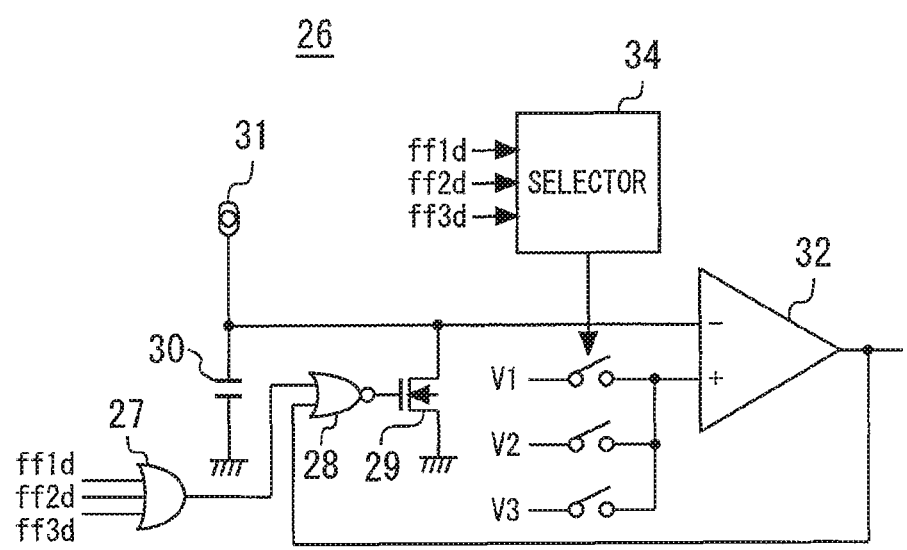
FIG. 9 is a diagram showing a second example of the timer circuit according to the embodiment of the present invention.

FIG. 9 is a diagram showing a second example of the timer circuit according to the embodiment of the present invention. The timer circuit 26 of the second example allows a selector 34 to switch threshold voltages V1, V2, and V3 depending on the types of error signals. In this manner, identification signals having pulse widths varying depending on the types of the error signals can be generated. In addition, in the comparator 32, since a relatively accurate threshold voltage can be generated by an internal power supply and resistive division therein, the accuracy of the output period of the identification signal can be improved.

Figure 10:
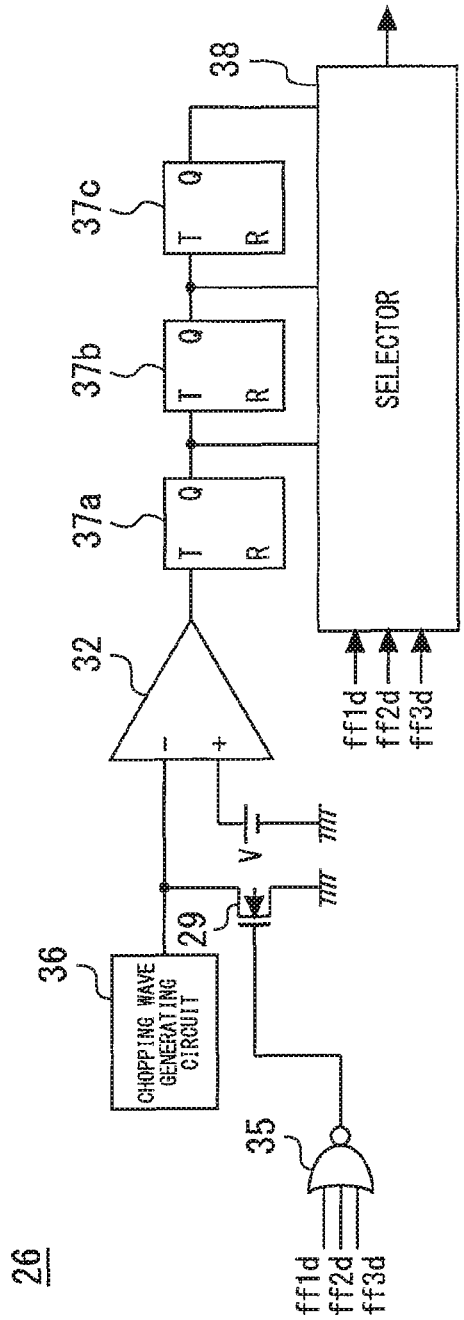
FIG. 10 is a diagram showing a third example of the timer circuit according to the embodiment of the present invention.

FIG. 10 is a diagram showing a third example of the timer circuit according to the embodiment of the present invention. The ff1*d*, ff2*d*, and ff3*d* are input to a NOR circuit 35. Depending on outputs from the NOR circuit 35, the transistor 29 connects or disconnects a chopping wave generating circuit 36 to/from the ground point. When any one of the ff1*d*, ff2*d*, and ff3*d* corresponding to error signals is input, the transistor 29 is turned off, and a fundamental wave generated by the chopping wave generating circuit 36 is output from the comparator 32. This fundamental wave is frequency-divided by T flip-flop circuits 37*a*, 37*b*, and 37*c*. A selector 38 switches frequency division ratios N depending on the types of the error signals to output a frequency-divided pulse signal. In this manner, even though the fundamental waves fluctuate, a signal having a pulse width which is N times the pulse width of the fundamental wave. For this reason, an output which is strong to a fluctuation in processes and which has relatively high accuracy can be obtained.

Figure 11:
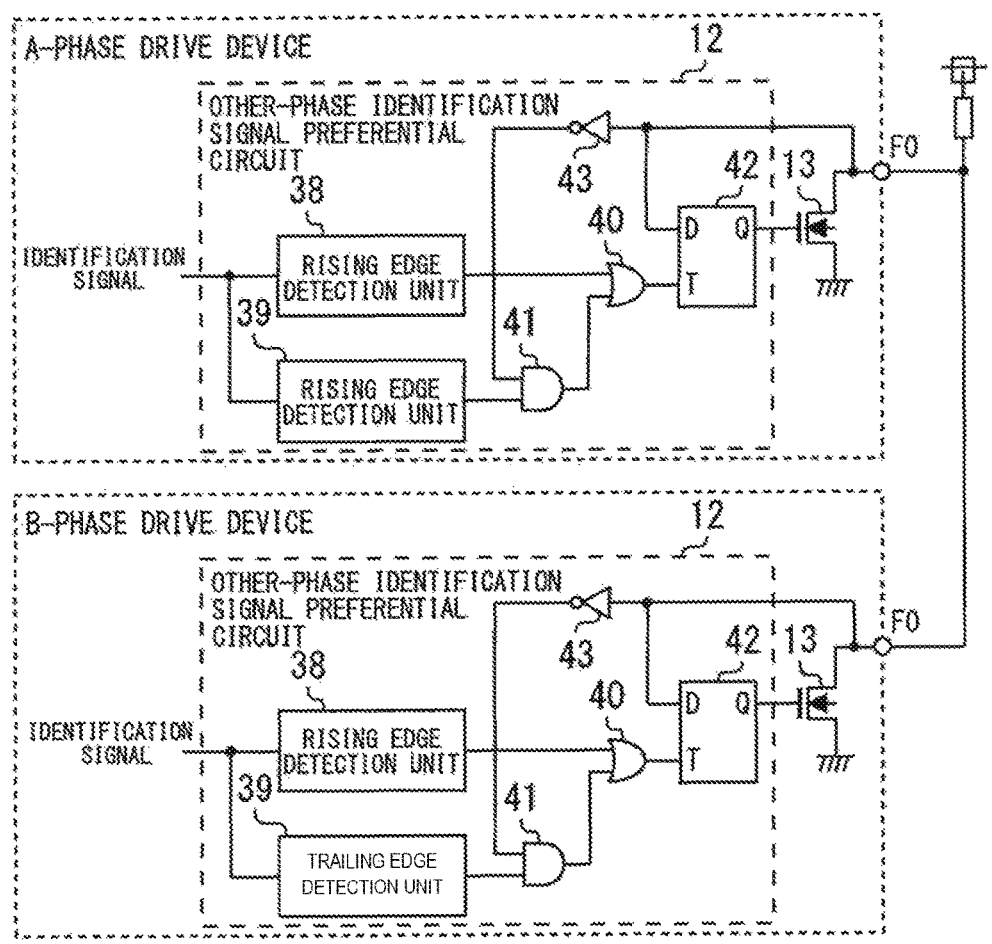
FIG. 11 is a diagram showing an other-phase identification signal preferential circuit according to the embodiment of the present invention.

FIG. 11 is a diagram showing an other-phase identification signal preferential circuit according to the embodiment of the present invention. In this case, any two of the drive devices 3*a* to 3*f* are exemplified as A-phase and B-phase drive devices. In each of the drive device, configurations except for a configuration around an other-phase identification signal preferential circuit 11 are not shown.

A rising edge detection unit 38 outputs a one-shot pulse in accordance with the rising edge of an own-phase identification signal. A trailing edge detection unit 39 outputs a one-shot pulse in accordance with the trailing edge of the own-phase identification signal. The output from the rising edge detection unit 38 is input to an OR circuit 40, and the output from the trailing edge detection unit 39 is also input to the OR circuit 40 through an AND circuit 41. An other-phase identification signal input through the FO terminal is input to a D terminal of a D flip-flop circuit 42 through an inverter 42 and input to an AND circuit 41 through an inverter 43. An output from the OR circuit 40 is input to a T terminal of the D flip-flop circuit 42. An output from the D flip-flop circuit 42 allows the transistor 13 to be turned on/off.

Figure 12:
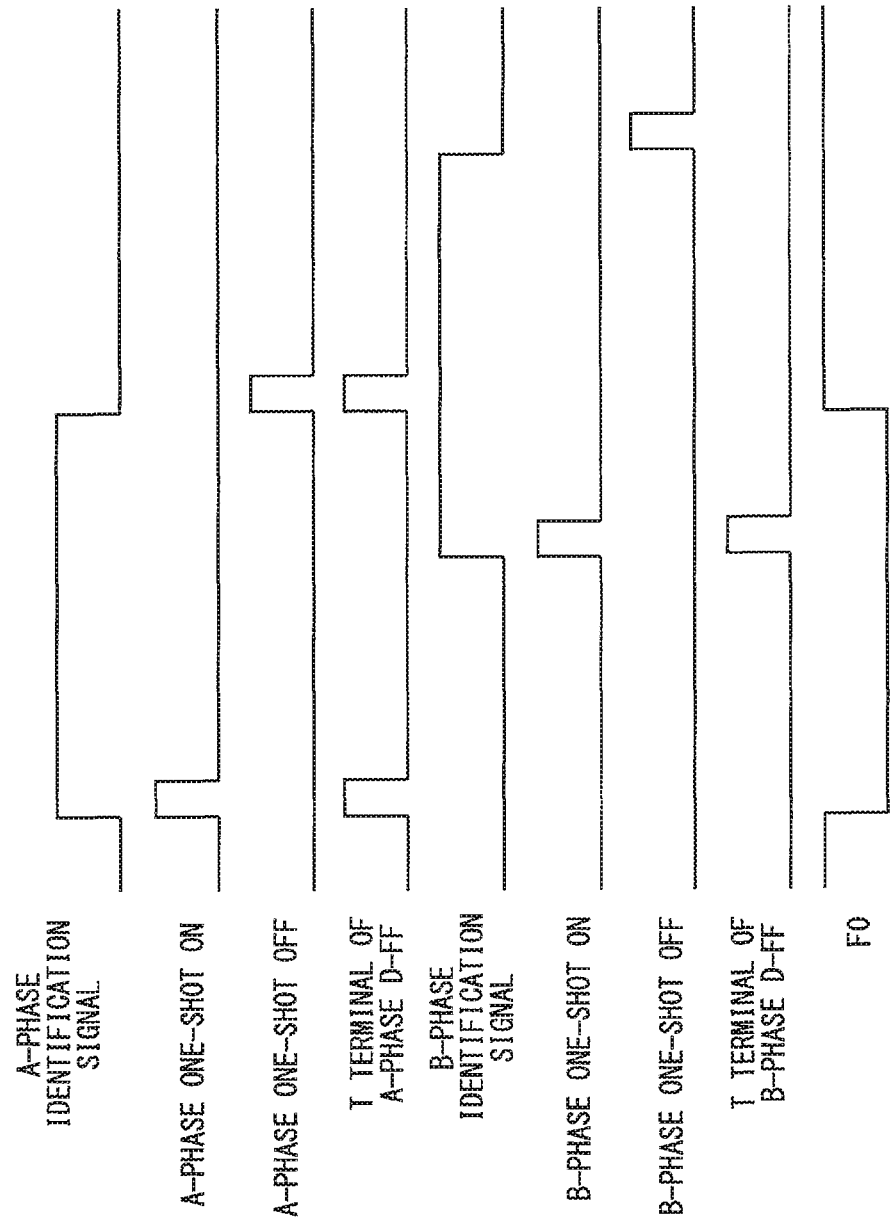
FIG. 12 is a timing chart showing an operation of the other-phase identification signal preferential circuit according to the embodiment of the present invention.
Figure 13:
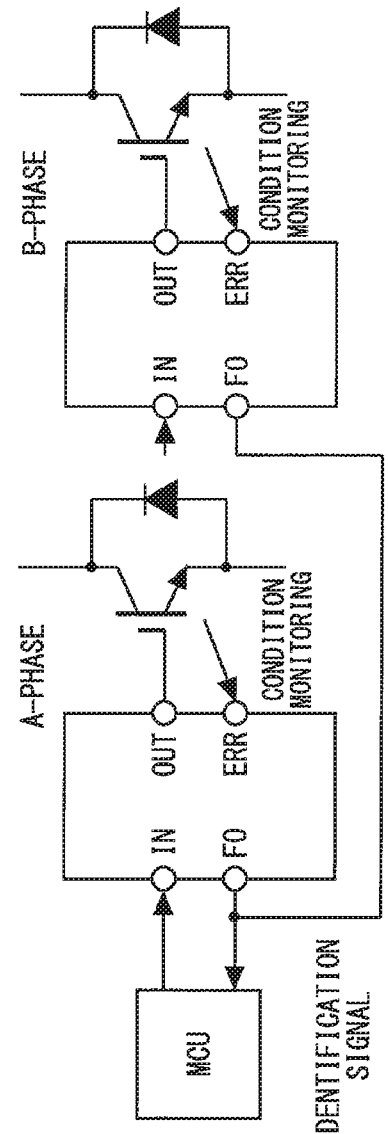
FIG. 13 is a diagram showing a conventional drive device for semiconductor element.
Figure 14:
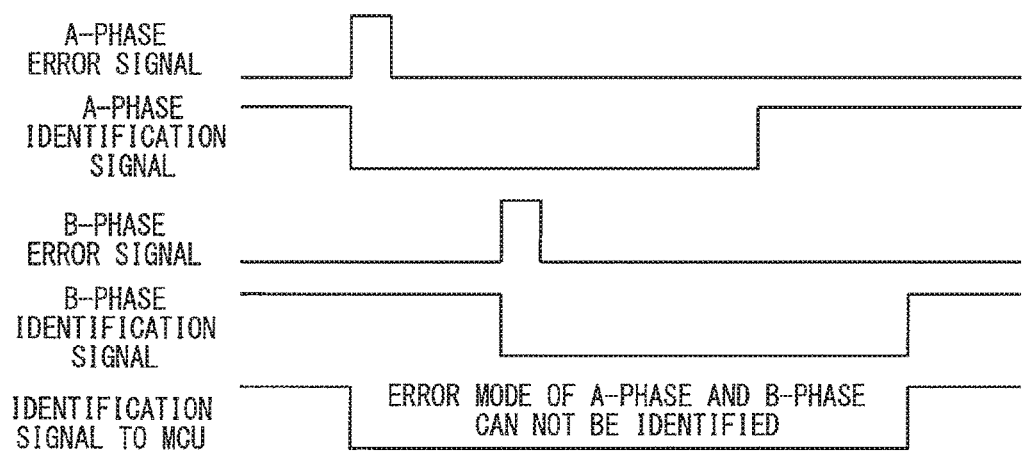
FIG. 14 is a timing chart showing an operation of the conventional drive device for semiconductor element.

FIG. 12 is a timing chart showing an operation of the other-phase identification signal preferential circuit according to the embodiment of the present invention. When an other-phase identification signal is input through the FO terminal, an input to the D terminal goes to low level. For this reason, even though the one-shot pulse is input from the rising edge detection unit 38 to the T terminal, no signal is output from a Q terminal of the D flip-flop circuit 42. Thus, the other-phase identification signal preferential circuit 12 does not allow an own-phase identification signal to output from the FO terminal when an other-phase identification signal is input through the FO terminal.

As described above, a protection operation signal having a pulse width equal to that of one of an error signal and an identification signal having a longer pulse width is generated in the embodiment of the present invention. The FO terminal receiving/outputting an identification signal and the FO_T terminal receiving/outputting a protection operation signal are independently configured. In this manner, an error protection operation can also be performed independently of the identification signal. Thus, an error protection operation coping with an error signal having a pulse width longer than that of the identification can also performed. Identification signals having pulse widths varying depending on the types of error signals are output to make it possible to identify an error mode on the MCU side.

When a second error signal is input while a protection operation signal corresponding to a first error signal previously input is outputting is output, the identification signal generating circuit 11 does not generate an identification signal corresponding to the second error signal. In this manner, even though a plurality of errors continuously occur in an own phase, identification signals corresponding to the errors are not mixed with each other. For this reason, the MCU side can identify an error mode.

The other-phase identification signal preferential circuit 12 does not allow an own-phase identification signal to output from the FO terminal when an other-phase identification signal is input through the FO terminal. More specifically, when an identification signal is output in an other-phase, an identification is suppressed from being output in an own-phase. In this manner, even though errors continuously occur in the own-phase and the other-phase, identification signals in both the phases are not mixed with each other. Thus, the MCU side can identify an error mode.

Since a change of pulse widths of identification signals can be achieved by a timer circuit in the identification signal generating circuit 11, the circuit can be simplified.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2015-217440, filed on Nov. 5, 2015 including specification, claims, drawings and summary, on which the Convention priority of the present application is based, is incorporated herein by reference in its entirety.

The invention claimed is:

1. A drive device to drive a semiconductor element comprising:
    an identification signal generating circuit generating an identification signal depending on a type of an input error signal;
    a protection operation signal generating circuit generating a protection operation signal, wherein the protection operation signal has a pulse width equal to that of one of the error signal and the identification signal, based on which has a longer pulse width;
    an other-phase identification signal terminal inputting an identification signal from an other-phase drive device or outputting the identification signal to the other-phase drive device;
    a other-phase protection operation signal terminal inputting a protection operation signal from the other-phase drive device or outputting the protection operation signal to the other-phase drive device; and
    a protection circuit performing an error protection operation depending on the protection operation signal generated by the protection operation signal generating circuit and the other-phase protection operation signal input through the protection operation signal terminal.

2. The drive device of claim 1, wherein when a second error signal is input while a protection operation signal corresponding to a first error signal previously input is outputting, the identification signal generating circuit does not generate the identification signal corresponding to the second error signal.

3. The drive device of claim 1, further comprising an other-phase identification signal preferential circuit which does not allow the identification signal to output from the identification signal terminal when the other-phase identification signal is input through the identification signal terminal.

4. The drive device of claim 1, wherein the identification signal has a pulse width varying depending on the type of the error signal.

5. The drive device of claim 4, wherein the identification signal generating circuit changes the pulse width of the identification signal depending on an output from a timer circuit, and
    when the error signal is input, the timer circuit begins to electrically charge a capacitor, outputs a signal until a voltage of the capacitor reaches a threshold voltage thereby indicating a time taken to charge the capacitor, and selects a current value for electrically charging the capacitor depending on the type of error signal.

6. The drive device of claim 4, wherein the identification signal generating circuit changes the pulse width of the identification signal depending on an output from a timer circuit, and
    when the error signal is input, the timer circuit begins to electrically charge a capacitor, outputs a signal until a voltage of the capacitor reaches a threshold voltage thereby indicating a time taken to charge the capacitor, and selects the threshold voltage depending on the type of error signal.

7. The drive device of claim 4, wherein the identification signal generating circuit changes the pulse width of the identification signal depending on an output from a timer circuit, and
    when the error signal is input, the timer circuit frequency-divides a fundamental wave, and switches a frequency division ratio depending on the type of error signal.

* * * * *